(12) United States Patent
Hsieh et al.

(10) Patent No.: US 10,728,674 B2
(45) Date of Patent: Jul. 28, 2020

(54) MICROPHONE PACKAGE

(71) Applicant: Solid State System Co., Ltd., Hsinchu (TW)

(72) Inventors: Tsung-Min Hsieh, New Taipei (TW); Li-Chi Tsao, Taichung (TW); Chien-Hsing Lee, Hsinchu County (TW); Jhyy-Cheng Liou, Hsinchu County (TW)

(73) Assignee: Solid State System Co., Ltd., Hsinchu (TW)

(*) Notice: Subject to any disclaimer, the term of this patent is extended or adjusted under 35 U.S.C. 154(b) by 0 days.

(21) Appl. No.: 16/112,777

(22) Filed: Aug. 27, 2018

(65) Prior Publication Data

US 2020/0068317 A1 Feb. 27, 2020

(51) Int. Cl.
| H04R 19/04 | (2006.01) |
| B81B 7/00 | (2006.01) |
| B81C 1/00 | (2006.01) |
| H04R 19/00 | (2006.01) |
| H04R 1/04 | (2006.01) |

(52) U.S. Cl.
CPC ........... *H04R 19/04* (2013.01); *B81B 7/0061* (2013.01); *B81C 1/00269* (2013.01); *H04R 1/04* (2013.01); *H04R 19/005* (2013.01); *B81C 2203/019* (2013.01); *B81C 2203/0118* (2013.01); *B81C 2203/035* (2013.01); *H04R 2201/003* (2013.01)

(58) Field of Classification Search
CPC .................................................. H04R 19/005
USPC .......................................... 381/175; 257/416
See application file for complete search history.

(56) References Cited

U.S. PATENT DOCUMENTS

| 6,781,231 | B2* | 8/2004 | Minervini | ............. | B81B 7/0064 |
| 8,189,820 | B2* | 5/2012 | Wang | ................... | H04R 19/005 |
| | | | | | 381/174 |
| 8,447,057 | B2* | 5/2013 | Goida | ...................... | H04R 1/02 |
| | | | | | 381/175 |
| 8,472,648 | B2* | 6/2013 | Wang | ................... | H04R 19/005 |
| | | | | | 381/175 |
| 8,577,063 | B2* | 11/2013 | Yang | ..................... | B81B 7/0061 |
| | | | | | 381/175 |

(Continued)

FOREIGN PATENT DOCUMENTS

| TW | 201526217 | 7/2015 |
| TW | 201540648 | 11/2015 |
| TW | 201615035 | 4/2016 |

OTHER PUBLICATIONS

"Office Action of Taiwan Counterpart Application", dated Feb. 27, 2020, p. 1-p. 15.

*Primary Examiner* — Suhan Ni
(74) *Attorney, Agent, or Firm* — JCIPRNET (57) ABSTRACT

A structure of micro-electro-mechanical-system (MEMS) microphone package includes a packaging substrate and an integrated circuit disposed on the packaging substrate. In addition, a MEMS microphone is disposed on the packaging substrate, wherein the MEMS microphone is electrically connected to the integrated circuit. A conductive adhesion layer is disposed on the packaging substrate, surrounding the integrated circuit and the MEMS microphone. A cap structure has a bottom part being adhered to the conductive adhesion layer. An underfill layer is disposed on the packaging substrate, covering an outer side of the conductive adhesion layer.

22 Claims, 12 Drawing Sheets (56) References Cited

U.S. PATENT DOCUMENTS

| | | | | |
|---|---|---|---|---|
| 8,902,604 B2* | 12/2014 | Zoellin | ................ | H04R 19/005 |
| | | | | 361/761 |
| 2006/0104468 A1* | 5/2006 | Yamamoto | ........... | H04R 19/016 |
| | | | | 381/361 |
| 2007/0041597 A1* | 2/2007 | Song | .................... | H04R 31/006 |
| | | | | 381/175 |
| 2008/0075309 A1* | 3/2008 | Chen | .................... | H04R 1/2819 |
| | | | | 381/175 |
| 2010/0155863 A1* | 6/2010 | Weekamp | ............. | B81C 1/0023 |
| | | | | 257/416 |

* cited by examiner

MICROPHONE PACKAGE

BACKGROUND

Technical Field

The invention is related to MEMS (Micro Electro Mechanical System) microphone package technology.

Description of Related Art

Microphone has been designed based on semiconductor fabrication technology, so as to greatly reduce the size. A MEMS microphone is a popular device used in electronic apparatus to sense acoustic signals, such as the communication voice.

After the MEMS microphones are fabricated on a wafer and cut into multiple dies, the MEMS microphone in single die is connected to an integrated circuit, such as an application-specific integrated circuit (ASIC), by packaging process.

To have a proper protection on the microphone with the ASIC, a metal cap is usually used to cover the MEMS microphone during the packaging process. Conventionally, the metal cap is disposed over a packaging substrate by a tin solder paste, so as to ground the metal cap.

Since the tin solder paste would splash at a high temperature, the splashed tin solder paste may contaminate the ASIC and/or the MEMS microphone. The MEMS microphone package may have a defect resulting in a reduced performance.

SUMMARY

The invention provides a microphone package, wherein a metal cap is disposed over a packaging substrate to avoid a contamination in a MEMS microphone and/or an ASIC.

The invention provides a structure of MEMS microphone package including a packaging substrate and an integrated circuit disposed on the packaging substrate. In addition, a MEMS microphone is disposed on the packaging substrate, wherein the MEMS microphone is electrically connected to the integrated circuit. A conductive adhesion layer is disposed on the packaging substrate, surrounding the integrated circuit and the MEMS microphone. A cap structure has a bottom part being adhered to the conductive adhesion layer. An underfill layer is disposed on the packaging substrate, covering an outer side of the conductive adhesion layer.

The invention provides a structure of MEMS microphone package including a packaging substrate and an integrated circuit disposed on the packaging substrate. In addition, a MEMS microphone is disposed on the packaging substrate, wherein the MEMS microphone is electrically connected to the integrated circuit. A plurality of conductive adhesion layers is distributed on the packaging substrate, surrounding the integrated circuit and the MEMS microphone. A cap structure has a bottom part being adhered to the plurality of the conductive adhesion layers. An underfill layer is disposed on the packaging substrate, surrounding the integrated circuit and the MEMS microphone, wherein a sidewall of each of the plurality of the conductive adhesion layers and gaps between the cap structure and the packaging substrate without the conductive adhesion layers are enclosed by the underfill layer.

A structure of MEMS microphone package, comprising a packaging substrate and an integrated circuit disposed on the packaging substrate. In addition, a MEMS microphone is disposed on the packaging substrate, wherein the MEMS microphone is electrically connected to the integrated circuit. A conductive adhesion layer is disposed on the packaging substrate, surrounding the integrated circuit and the MEMS microphone. A cap structure disposed on the packaging substrate includes a top plate; a wall, having a foot standing on the packaging substrate and surrounding the integrated circuit and the MEMS microphone, wherein the top plate is disposed on the perpendicular wall; a bottom horizontal part, disposed on the packaging substrate between the foot of the perpendicular wall and the conductive adhesion layer; and a covering part, disposed on the conductive adhesion layer and connected to the bottom horizontal part.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

The invention is directed to a MEMS microphone package, wherein a solder splashing effect can be effectively reduced.

Several embodiments are provided for description of the invention. However, the invention is not just limited to the embodiments. In addition, a combination between the provided embodiments may also be made so as to have other embodiments.

Figure 1:
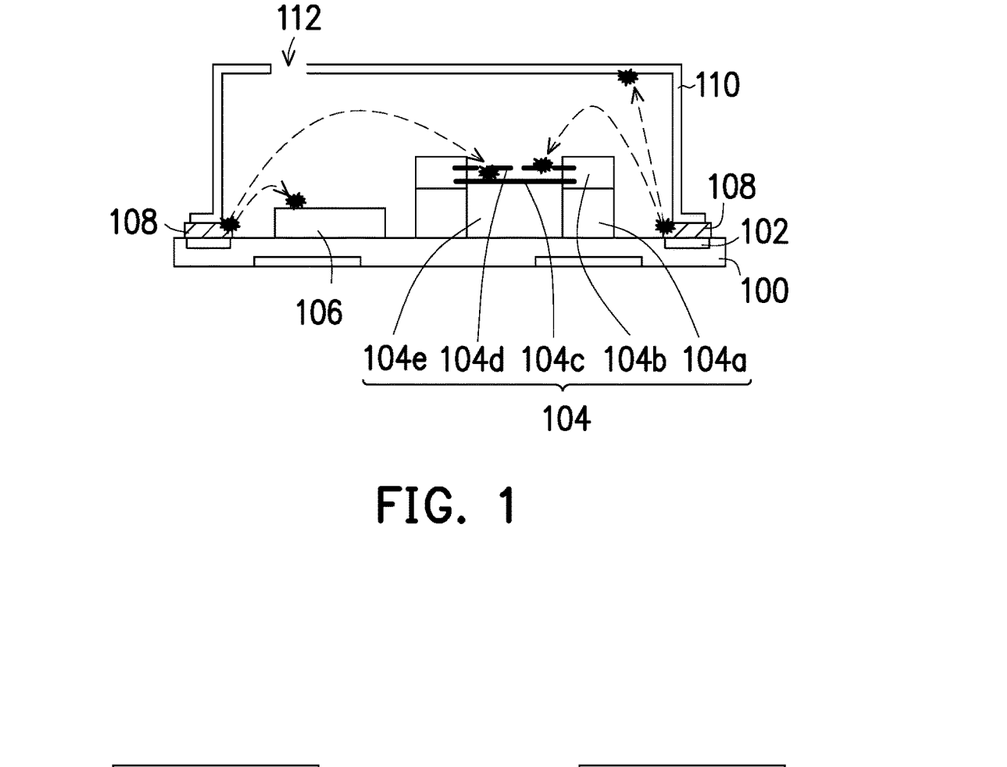
FIG. 1 is a drawing, schematically illustrating a cross-sectional structure of MEMS microphone package with solder splashing effect, according to an embodiment of the invention.

FIG. 1 is a drawing, schematically illustrating a cross-sectional structure of MEMS microphone package with solder splashing effect, according to an embodiment of the invention. Referring to FIG. 1, the invention has at least looked into the MEMS microphone package and found the solder splashing effect. The mechanism of solder splashing effect is as following.

After a MEMS microphone 104 and an integrated circuit 106 have been fabricated, both of them are packaged together on a packaging substrate 100, such as a printed circuit board (PCB) substrate. The packaging substrate 100 has a circuit route with connection pads 102 for an electrical connection between the MEMS microphone 104 and the integrated circuit 106. However, the invention is not limited thereto. In an alternative embodiment, a well-known bonding wire may also be used.

The integrated circuit can be the ASIC die for example. A basic structure of the MEMS microphone 104 includes a semiconductor substrate 104a with a chamber 104e. A dielectric layer 104b for supporting an inner structure is disposed on the semiconductor substrate 104a. A backplate 104c is supported by the dielectric layer 104b, wherein the backplate 104c has venting holes to receive voice from an acoustic hole 112 of a cap structure 110. A diaphragm 104d supported by the dielectric layer 104b vibrates to respond a vibration of air pressure induced by an acoustic signal. A capacitance variation between the diaphragm 104c and the backplate 104d is detected and converted into voice frequency in a form of electrical signal.

The cap structure 110 is usually a metal cap used to cover the MEMS microphone 104 and the integrated circuit 106 for a protection purpose. The cap structure 110 such as a metal cap, is also grounded to further shield noises, wherein the cap structure 110 is connected to the packaging substrate 100 through a solder paste layer 108, which is usually a tin solder paste.

As looked into by the invention, when the solder paste layer 108 is melted to adhere the metal cap structure 110 to the packaging substrate 100, a material of solder paste may splash under a high operating temperature. The splashed solder paste may enter the MEMS microphone 104 and/or the integrated circuit 106, causing a contamination to the device. The performance of the MEMS microphone package may be reduced or even destroyed.

Figure 2:
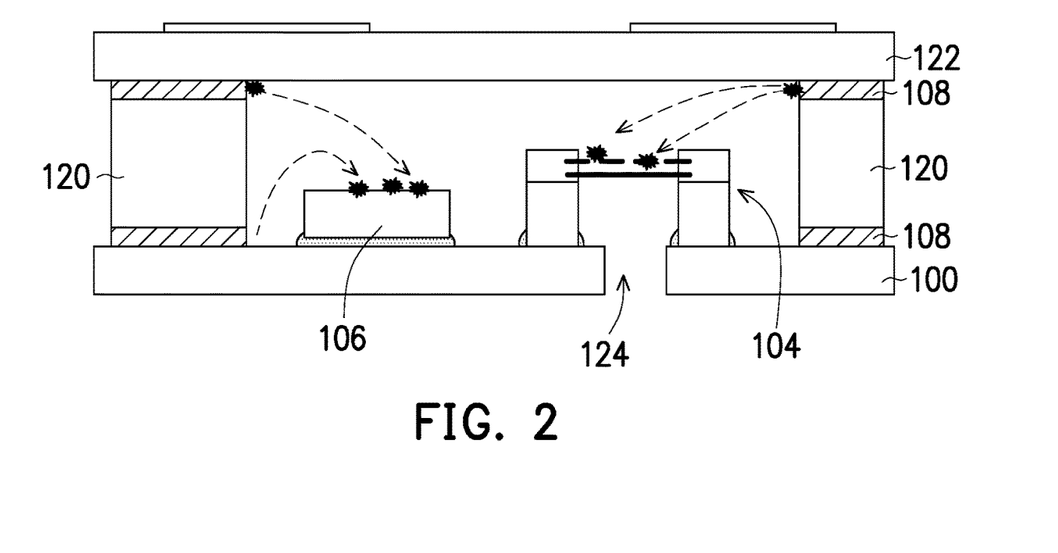
FIG. 2 is a drawing, schematically illustrating a cross-sectional structure of MEMS microphone package with solder splashing effect, according to an embodiment of the invention.

FIG. 2 is a drawing, schematically illustrating a cross-sectional structure of MEMS microphone package with solder splashing effect, according to an embodiment of the invention. The MEMS microphone package is not limited to the structure in FIG. 1. Referring to FIG. 2, which is an example of different structure of MEMS microphone package, an acoustic hole 124 may be formed in the packaging substrate 100. Further, a cap structure in this example can be formed by multiple parts including a solder paste layer 108, a wall 120, another solder paste layer 108 and a top plate 122, which are stacked to form the cap structure. However, in this MEMS microphone package, the solder splashing effect still occurs.

To reduce or eliminate the solder splashing effect, the invention further proposes other MEMS microphone packages. In the embodiments with respect to the structure in FIG. 1, FIG. 3 is a drawing, schematically illustrating a cross-sectional structure of MEMS microphone package without solder splashing effect, according to an embodiment of the invention.

Figure 3:
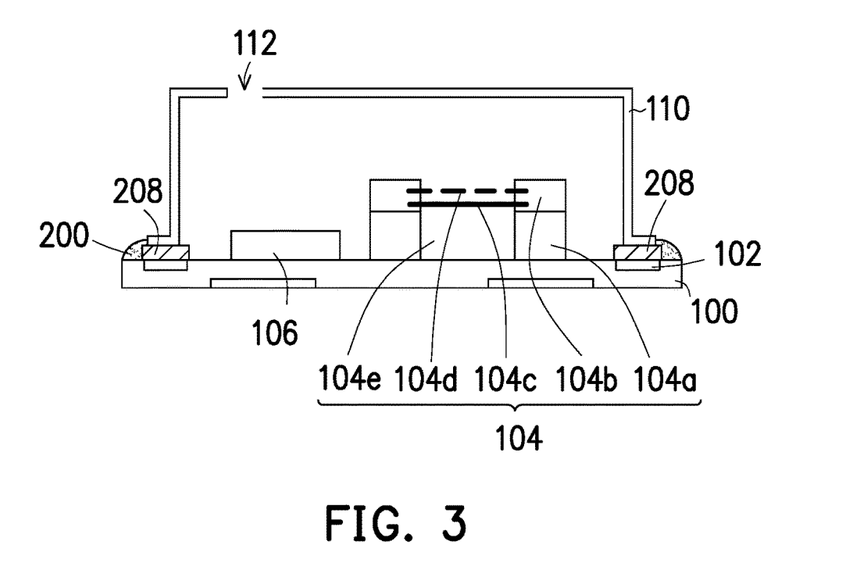
FIG. 3 is a drawing, schematically illustrating a cross-sectional structure of MEMS microphone package without solder splashing effect, according to an embodiment of the invention.

Referring to FIG. 3 and in accordance with the structure in FIG. 1, the invention uses a conductive adhesion layer 208, such as conductive epoxy layer, to replace the solder paste layer 108 in FIG. 1. The conductive adhesion layer 208 does not cause the splashing effect. However, the conductive adhesion layer 208 after curing process may have some seams existing in the conductive adhesion layer 208. The invention uses an underfill layer 200 to cover an outer side of the conductive adhesion layer 208. The underfill layer 200 can enter the seams to fill them.

Figure 4:
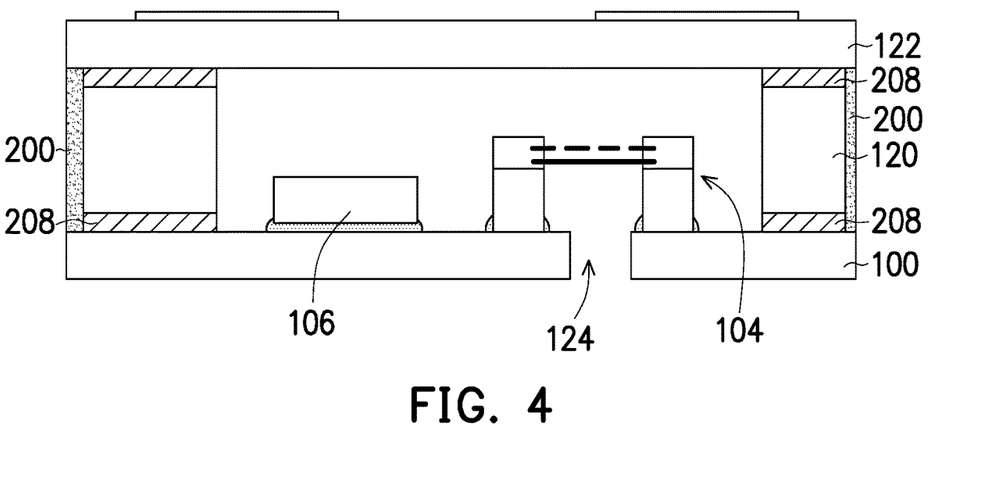
FIG. 4 is a drawing, schematically illustrating a cross-sectional structure of MEMS microphone package without solder splashing effect, according to an embodiment of the invention.

FIG. 4 is a drawing, schematically illustrating a cross-sectional structure of MEMS microphone package without solder splashing effect, according to an embodiment of the invention. Referring to FIG. 4, in accordance with the structure of the MEMS microphone package in FIG. 2, the conductive adhesion layer 208 is used to replace the solder paste layer 108 and the underfill layer 200 also covers the conductive adhesion layer 208, wherein a small portion of the underfill layer 200 can enter and fill the seams in the conductive adhesion layer 208 after the curing process. As a result, the splashing effect is effectively eliminated in this embodiment.

To package the MEMS microphone as shown in FIG. 3 and FIG. 4, a packaging method is provided. FIGS. 5A-5F are drawings, schematically illustrating cross-sectional structure of fabrication flow of MEMS microphone package, according to an embodiment of the invention.

Figure 5A:
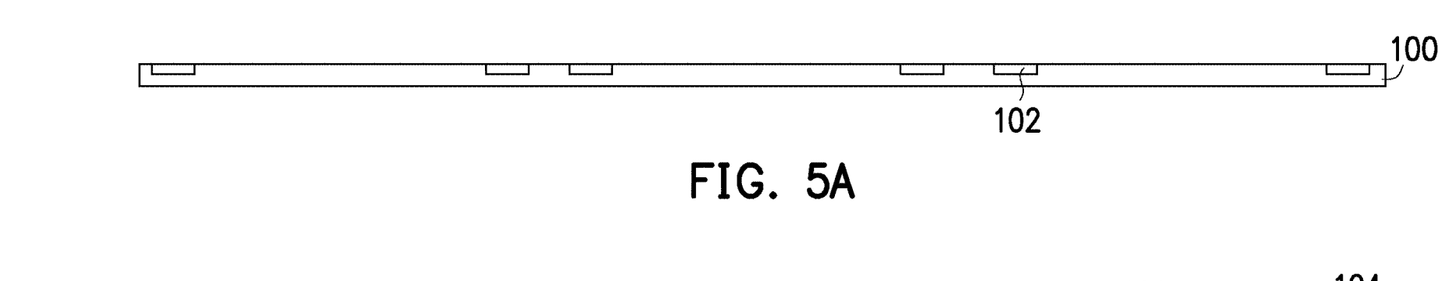
FIGS. 5A-5F are drawings, schematically illustrating cross-sectional structure of fabrication flow for MEMS microphone package, according to an embodiment of the invention.
Figure 5B:
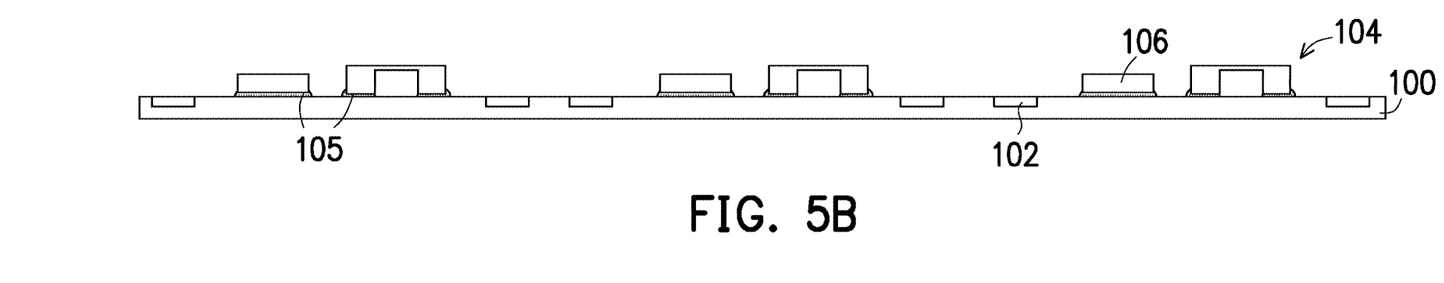

Referring to FIG. 5A, a packaging substrate 100, such as a PCB substrate, is provided. Connection pads 102 are formed in the packaging substrate 100. Referring to FIG. 5B, an integrated circuit 106 and a MEMS microphone 104 are disposed on the packaging substrate 100 through an adhesive material 105. The integrated circuit 106 and the MEMS microphone 104 are connected through a circuit route in the packaging substrate 100 or by conventional bonding wires (not shown). The invention is not limited to the embodiments.

Figure 5C:
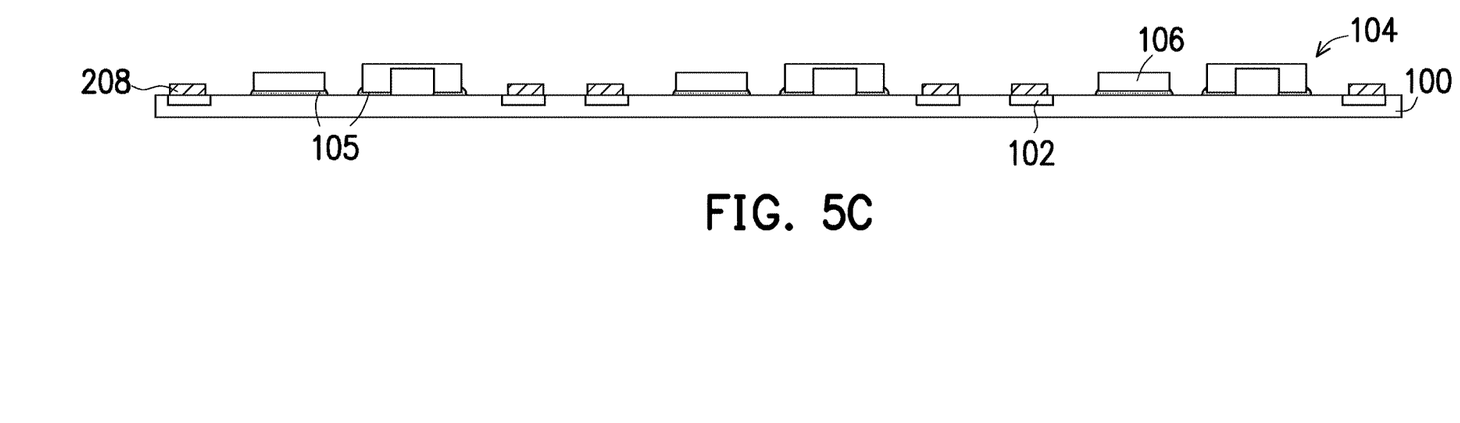

Referring to FIG. 5C, a conductive adhesion layer 208, such as conductive epoxy material, is disposed on the connection pads 102 of the packaging substrate. The conductive adhesion layer 208 in an embodiment is surrounding the MEMS microphone 104 and the integrated circuit 106.

Figure 5D:
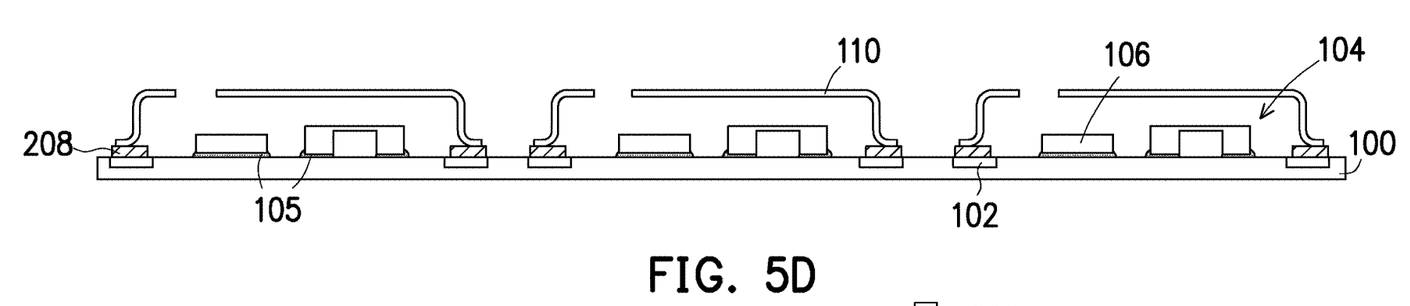

Referring to FIG. 5D, a cap structure 110 is disposed on the conductive adhesion layer 208. In other words, the cap structure 110 is disposed over the packaging substrate 100 through the conductive adhesion layer 208, which is disposed on the connection pad 102, surrounding the MEMS microphone 104 and the integrated circuit 106. The cap structure 110 in an embodiment is a metal cap, which may have an acoustic hole. At this stage, a curing process such as a baking process, is performed on the conductive adhesion layer 208, so as to solidify the conductive adhesion layer 208.

Figure 5E:
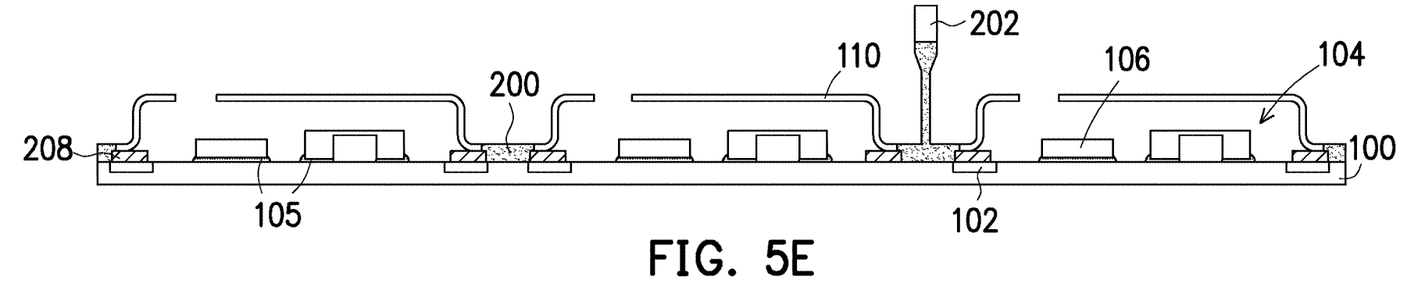

Referring to FIG. 5E, an underfill material is injected from an injection apparatus 202 to an outer side of the conductive adhesion layer 208 and a bottom of the cap structure 110. As a result, the underfill layer 200 is formed on the packaging substrate 100 to cover the conductive adhesion layer 208, wherein a portion of the underfill material in a liquid state may enter and fill the seams possibly occurring in the conductive adhesion layer 208 after the curing process.

Figure 5F:
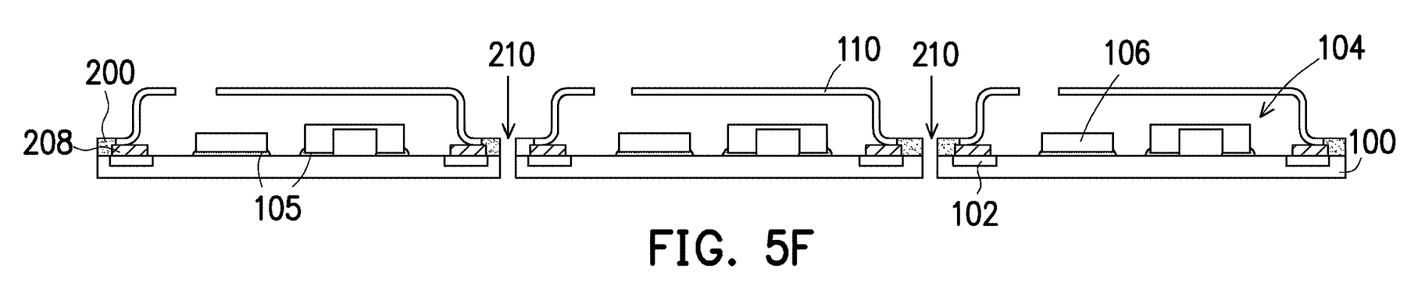

Referring to FIG. 5F, a cutting process 210 is performed along a scribe line preserved on the packaging substrate 100, so as to have a plurality of MEMS microphone packages.

As observed in the MEMS microphone package, the solder splashing effect can be effectively eliminated.

To fabricate the MEMS microphone package as shown in FIG. 4, other embodiments are provided. FIGS. 6A-6F are drawings, schematically illustrating cross-sectional structure of fabrication flow for MEMS microphone package, according to an embodiment of the invention.

Figure 6A:
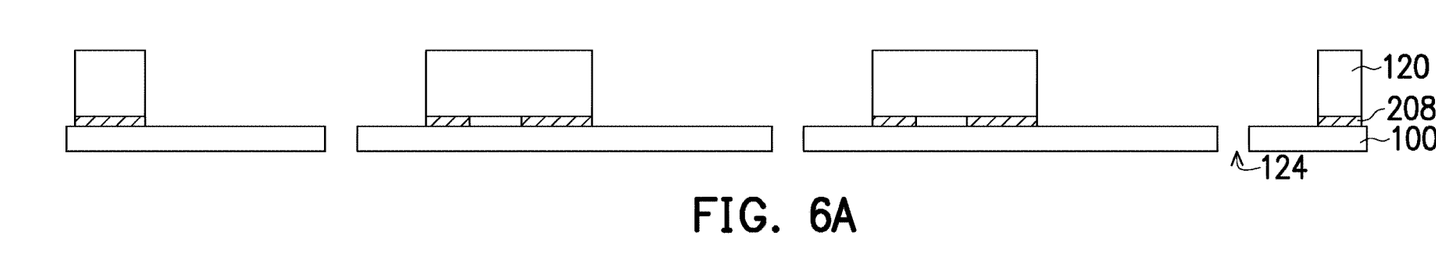
FIGS. 6A-6F are drawings, schematically illustrating cross-sectional structure of fabrication flow for MEMS microphone package, according to an embodiment of the invention.
Figure 6B:
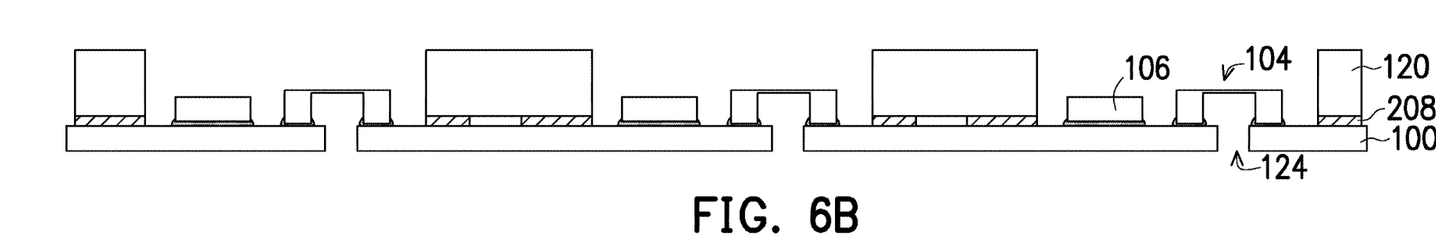
Figure 6C:
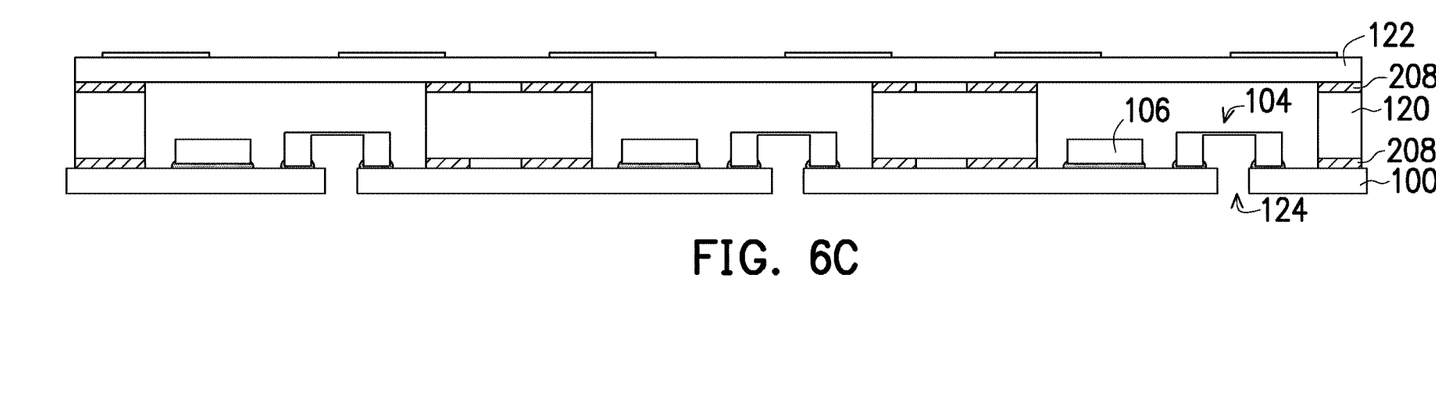

Referring to FIG. 6A, a packaging substrate 100 is provided. In this embodiment, an acoustic hole 124 is formed in the packaging substrate 100. A conductive adhesion layer 208 is formed on the packaging substrate 100. Referring to FIG. 6B, a wall 120 is disposed on the conductive adhesion layer 208, surrounding an integrated circuit 106 and a MEMS microphone 104. Referring to FIG. 6C, a top conductive adhesion layer 208 is formed on a top of the wall 120. A top plate 122 is disposed on the top conductive adhesion layer 208.

Figure 6D:
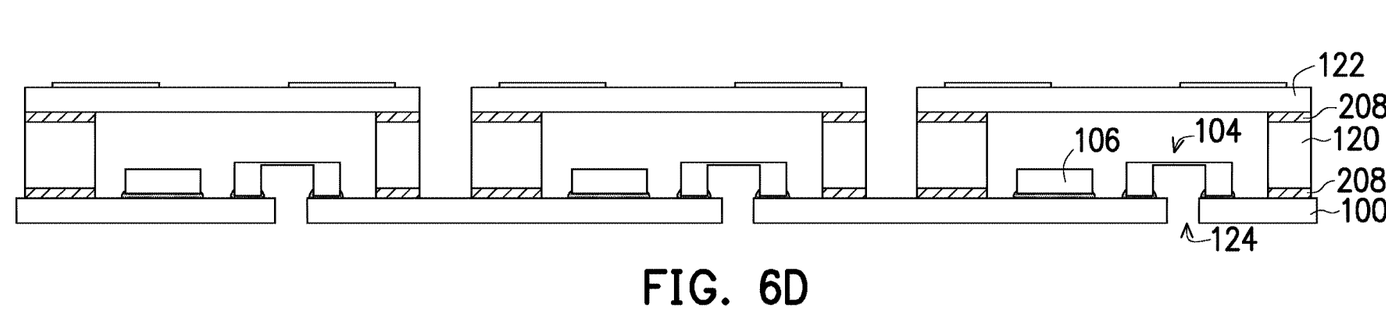
Figure 6E:
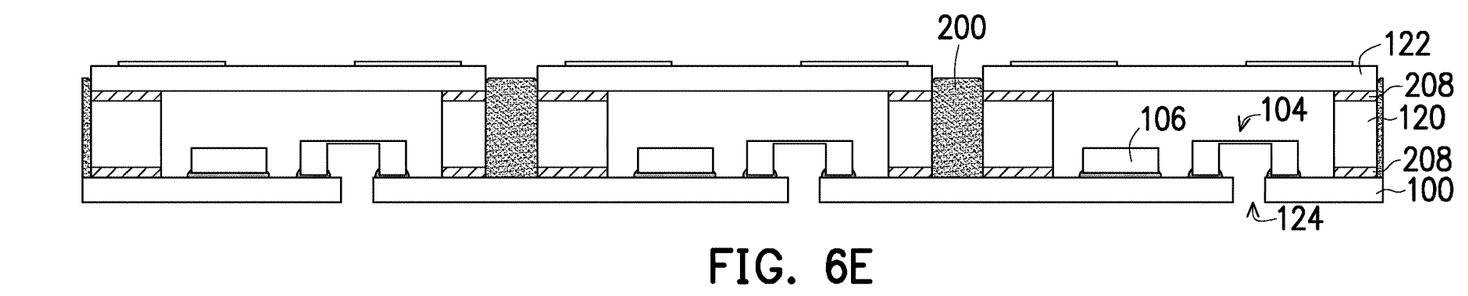

Referring to FIG. 6D, a portion of two conductive adhesion layers 208 and the wall 120 is removed to expose the packaging substrate 100 and create a gap between two adjacent MEMS microphone packages. Referring to FIG. 6E, after the curing process on the conductive adhesion layer 208, an underfill layer 200 is injected to fill the gap between two adjacent MEMS microphone packages. The underfill layer 200 covers the two conductive adhesion layers 208 and fills the seams, which possibly exist in the conductive adhesion layer 208.

Figure 6F:
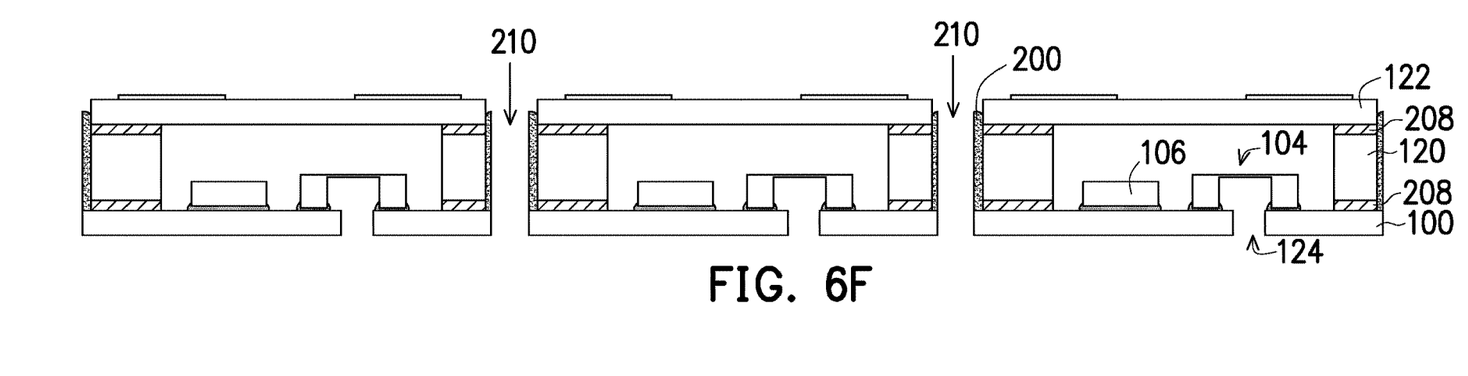

Referring to FIG. 6F, the MEMS microphone packages are singulated by cutting over a scribe line preserved on the packaging substrate 100.

Figure 7:
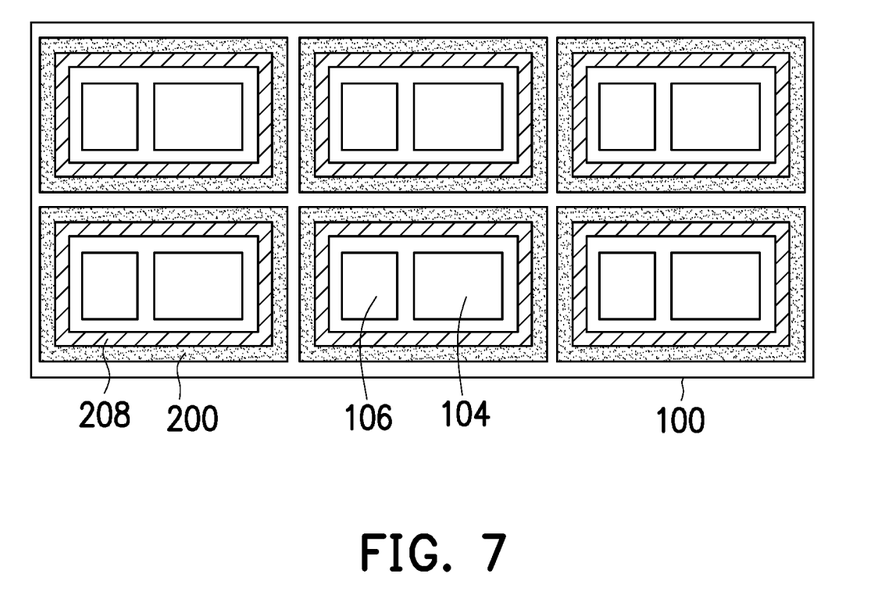
FIG. 7 is a drawing, schematically illustrating a relation in top view for the conductive epoxy layer and the underfill, according to an embodiment of the invention.

FIG. 7 is a drawing, schematically illustrating a relation in top view for the conductive adhesion layer and the underfill, according to an embodiment of the invention. Referring to FIG. 7, the relative position between the conductive adhesion layer 208 and the underfill layer 200 in accordance with the MEMS microphone package in FIG. 3 is viewed from the top, the underfill 200 is in between the packaging substrate 100 and the outer side of the conductive adhesion layer 208, while the cap structure 110 (not shown in FIG. 7) is disposed on the conductive adhesion layer 208. The conductive adhesion layer 208 in an example is surrounding the MEMS microphone 104 and the integrated circuit 106.

Figure 8:
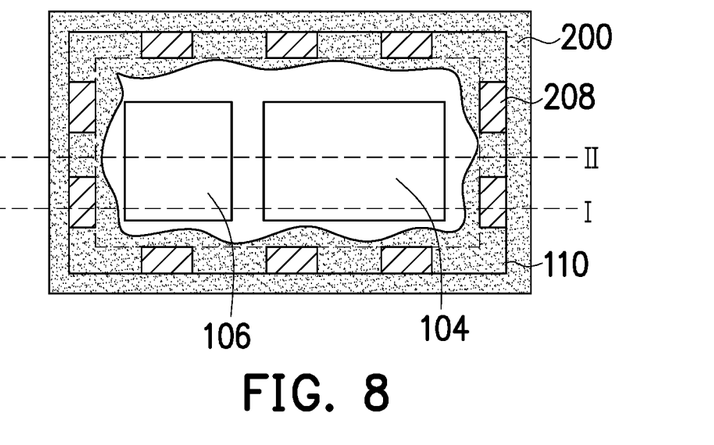
FIG. 8 is a drawing, schematically illustrating a relation in top view for the conductive epoxy layer and the underfill, according to an embodiment of the invention.
Figure 9:
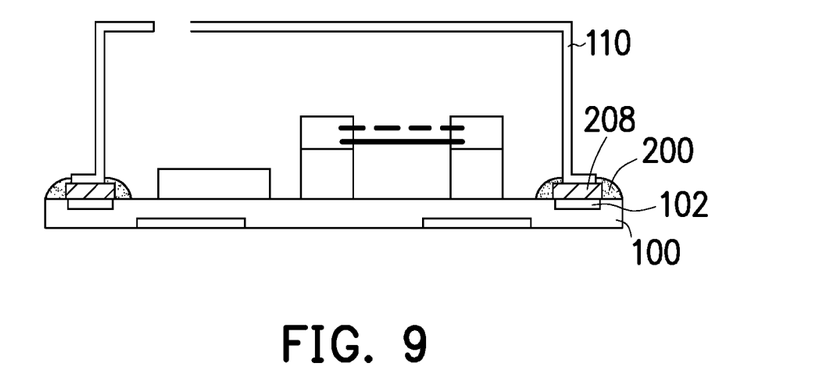
FIG. 9 is a drawing, schematically illustrating a cross-sectional structure along I-I of MEMS microphone package in FIG. 8, according to an embodiment of the invention.
Figure 10:
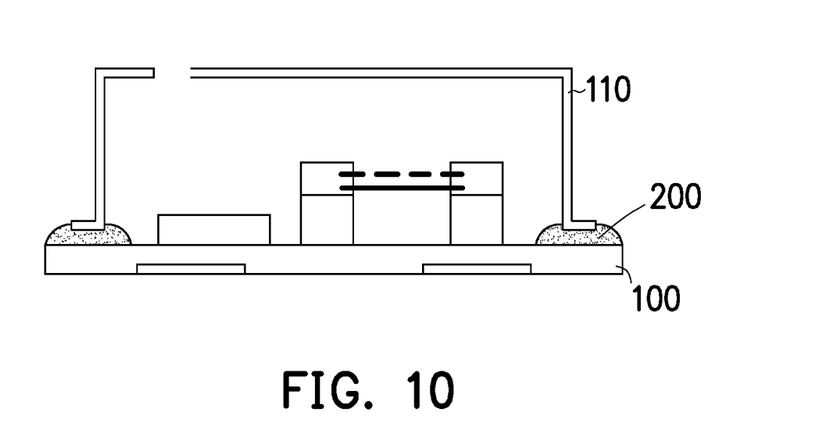
FIG. 10 is a drawing, schematically illustrating a cross-sectional structure along II-II of MEMS microphone package in FIG. 8, according to an embodiment of the invention.

FIG. 8 is a drawing, schematically illustrating a relation in top view for the conductive adhesion layer and the underfill, according to an embodiment of the invention. FIG. 9 is a drawing, schematically illustrating a cross-sectional structure along I-I of MEMS microphone package in FIG. 8, according to an embodiment of the invention. FIG. 10 is a drawing, schematically illustrating a cross-sectional structure along II-II of MEMS microphone package in FIG. 8, according to an embodiment of the invention.

Referring to FIG. 8 in accordance with FIG. 9 or FIG. 10, a plurality of conductive adhesion layers 208 are distributed on the packaging substrate 100, surrounding the MEMS microphone 104 and the integrated circuit 106.

The conductive adhesion layers 208 in an embodiment can be a solder paste layer, but the invention is not limited thereto. The conductive adhesion layers 208 in an embodiment are not continuously surrounding the MEMS microphone 104 and the integrated circuit 106. In this manner, there are gaps exiting between the conductive adhesion layers 208 as seen in FIG. 8.

In this embodiment, when the cap structure 110 is disposed on the conductive adhering layers 208, as shown in FIG. 9 at the cutting line I-I, there are gaps between the cap structure 110 and the packaging substrate 100 but the gaps are disposed by the conductive adhesion layers 208, which is in a form of conductive adhesion island. Further as shown in FIG. 10 along the cutting line II-II, there also are gaps existing between the cap structure 110 and the packaging substrate 100 but remaining a free space before the underfill layer 200 is formed. The gaps in free space allow the underfill material to be injected through and extending to inside region. As a result, the underfill layer 200 covers both the outer side and the inner side of the conductive adhesion layers 208. As previously mentioned, in an embodiment, the conductive adhesion layers 208 can be a solder paste but the invention is not limited thereto.

To fabricate the MEMS microphone package in FIGS. 8-10, the packaging process is modified. FIGS. 11A-11F schematically illustrating top-view structures of fabrication flow for MEMS microphone package, according to an embodiment of the invention.

Figure 11A:
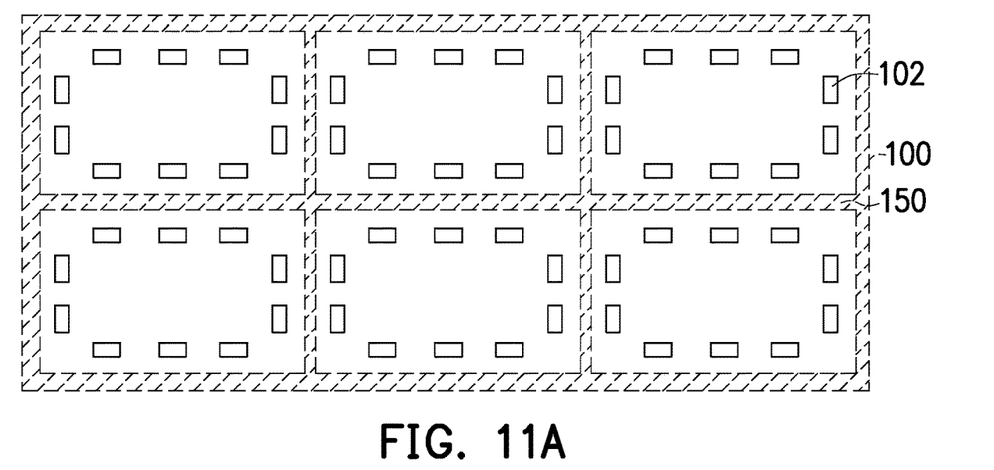
FIG. 11A-11F schematically illustrating top-view structures of fabrication flow for MEMS microphone package, according to an embodiment of the invention.

Referring to FIG. 11A, a packaging substrate 100 is provided. A scribe line 150 is preserved on the packaging substrate 100 for a singulation process. In an embodiment, a plurality of connection pads 102 are distributed on the packaging substrate 100 surrounding a preserved area. The plurality of the connection pads 102 in an embodiment is not continuous.

Figure 11B:
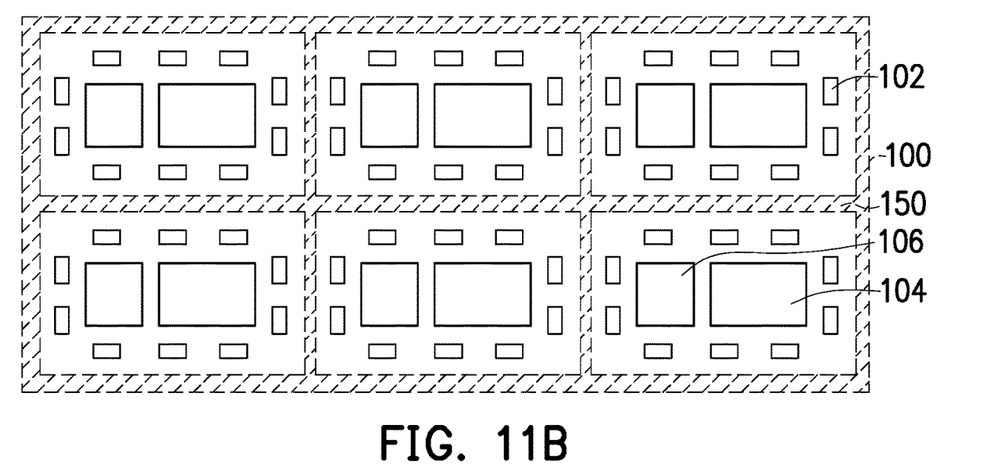

Referring to FIG. 11B, the MEMS microphone 104 and the integrated circuit 106 are disposed on the packaging substrate 100 in the preserved area, and discontinuously surrounded by the connection pads 102.

Figure 11C:
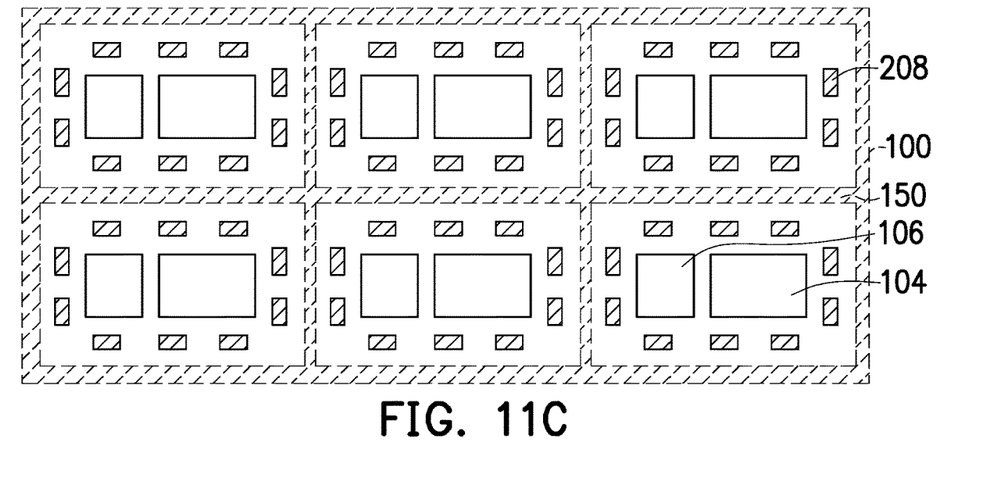
Figure 11D:
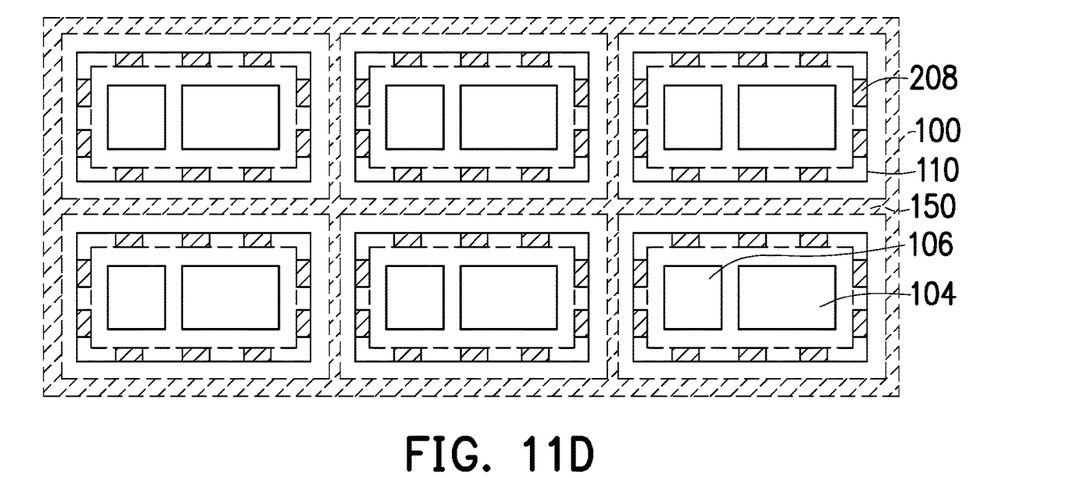

Referring to FIG. 11C, a plurality of conductive adhesion layers 208, such as a solder paste, are disposed on the plurality of the connection pads 102, in which the conductive adhesion layers 208 are in a form of conductive adhesion islands in discrete distribution. Referring to FIG. 11D, a cap structure 110, such as a metal cap, is disposed on the plurality of the conductive adhesion layers 208 by a reflow process on the solder paste.

Figure 11E:
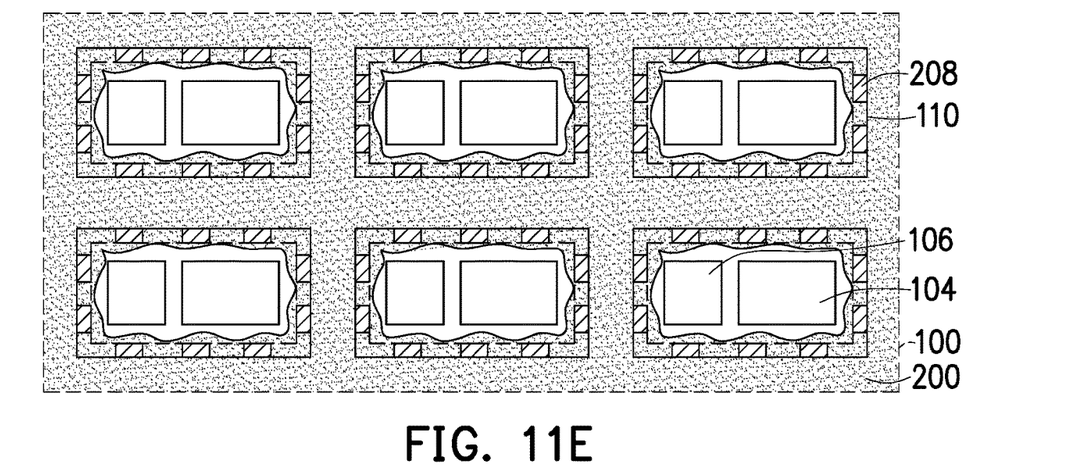
Figure 11F:
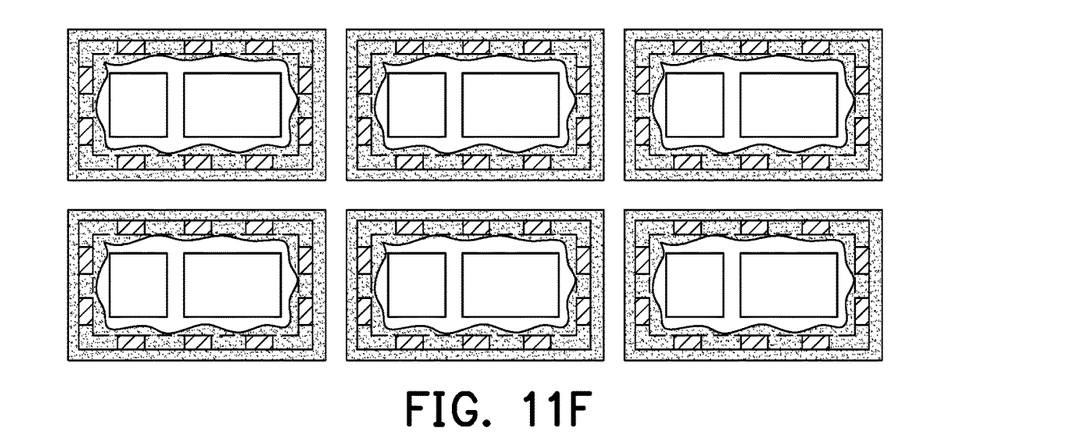

Referring to FIG. 11E, an underfill material is injected onto the packaging substrate 100 to form an underfill layer 200. Since there are gaps between the cap structure 110 and the packaging substrate 100, the underfill material of the underfill layer 200 can flow through the gaps and covers an inner side of the conductive adhesion layers 208. Referring to FIG. 11F, the packaging substrate 100 is cut along the scribe line 150 (shown in FIG. 11A), so as to have a plurality of the MEMS microphone packages.

Figure 12:
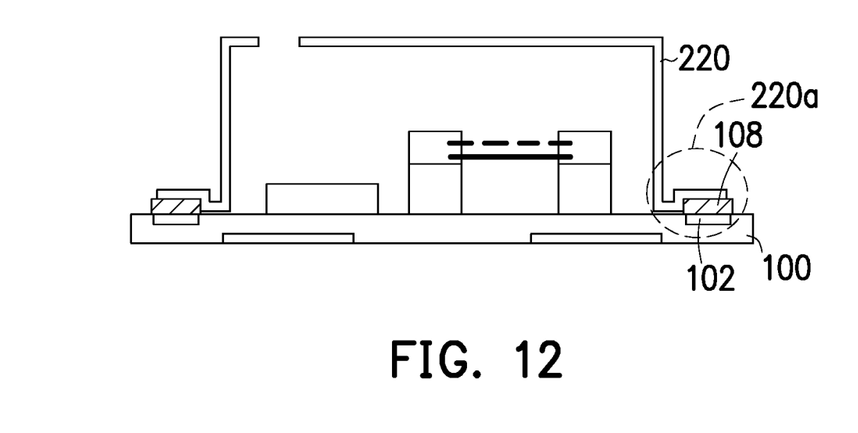
FIG. 12 is a drawing, schematically illustrating a cross-sectional structure of MEMS microphone package without solder splashing effect, according to an embodiment of the invention.

In other embodiments, the solder splashing effect can be reduced while the conventional solder paste is used. FIG. 12 is a drawing, schematically illustrating a cross-sectional structure of MEMS microphone package without solder splashing effect, according to an embodiment of the invention.

Referring to FIG. 12, in comparison with the structure in FIG. 1, a cap structure 220 is proposed with a modification in a region 220a. A conventional solder paste can be used to form a solder paste layer 108. Only the details of the cap structure 220 are described here and the details of the other parts are not repeated here.

The cap structure 220 such as a metal cap is disposed over a packaging substrate 100. The cap structure 200 generally includes a top plate; a wall, having a foot standing on the packaging substrate 100 and surrounding an integrated circuit 106 and a MEMS microphone 104, wherein the top plate is disposed on the wall; a bottom horizontal part, disposed on the packaging substrate 100 between the foot of the wall and the solder paste layer 108; and a covering part, disposed on the solder paste layer 108 and connecting to the bottom horizontal part. As noted, the solder paste layer 108 is taken as an embodiment for descriptions. Generally, the solder paste layer 108 can also be the conductive adhesion layer in another embodiment.

This step-like structure seen in a cross-sectional view in the region 220a can isolate the solder paste layer 108. The solder paste layer 108 at a temperature of reflow process would not splash to the integrated circuit 106 and/or the MEMS microphone 104.

As to the packaging method, FIGS. 13A-13E are drawings, schematically illustrating cross-sectional structure of fabrication flow for MEMS microphone package, according to an embodiment of the invention.

Figure 13A:
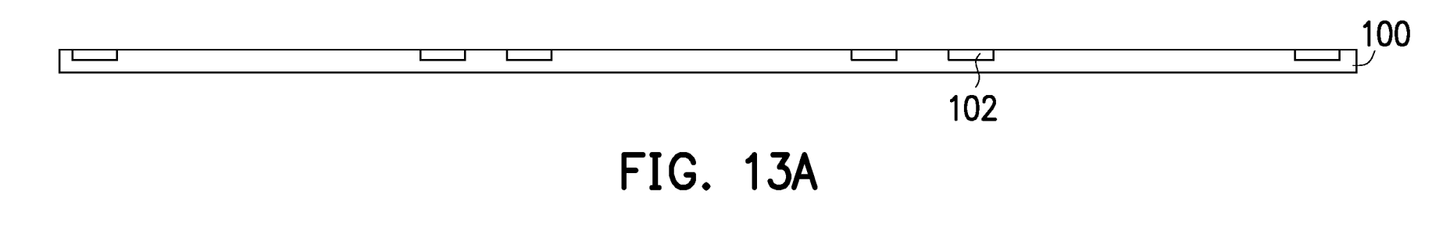
FIGS. 13A-13E are drawings, schematically illustrating cross-sectional structure of fabrication flow for MEMS microphone package, according to an embodiment of the invention.
Figure 13B:
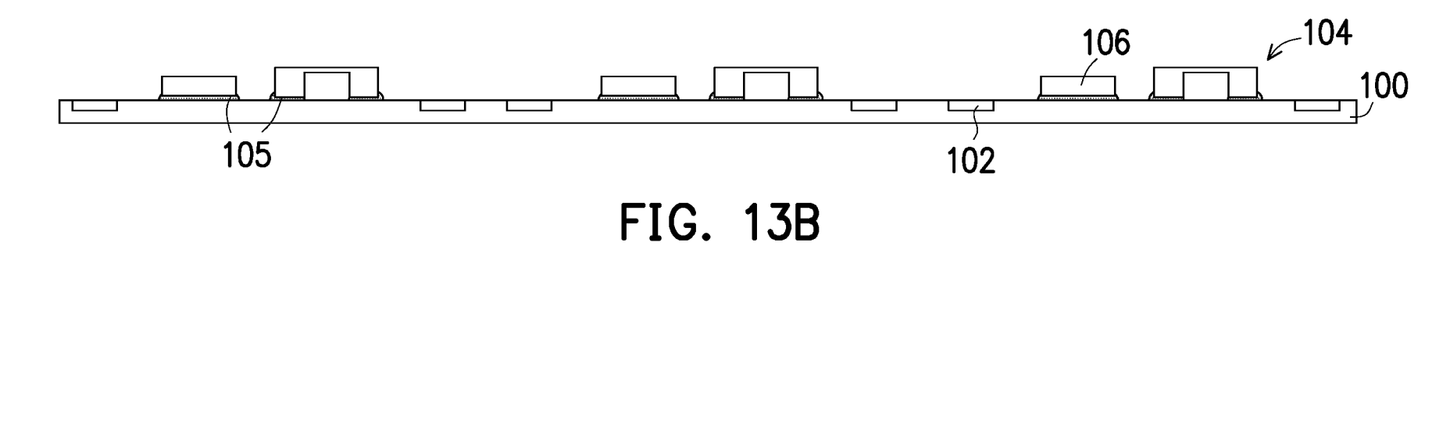

Referring to FIG. 13A, a packaging substrate 100 with a connection pad 102 is provided. Referring to FIG. 13B, an integrated circuit 106 and a MEMS microphone 104 are disposed on the packaging substrate 100 through the adhesion material 105. The integrated circuit 106 and the MEMS microphone 104 are connected through a circuit route in the packaging substrate 100 or by conventional bonding wires (not shown). However, the invention is not limited thereto.

Figure 13C:
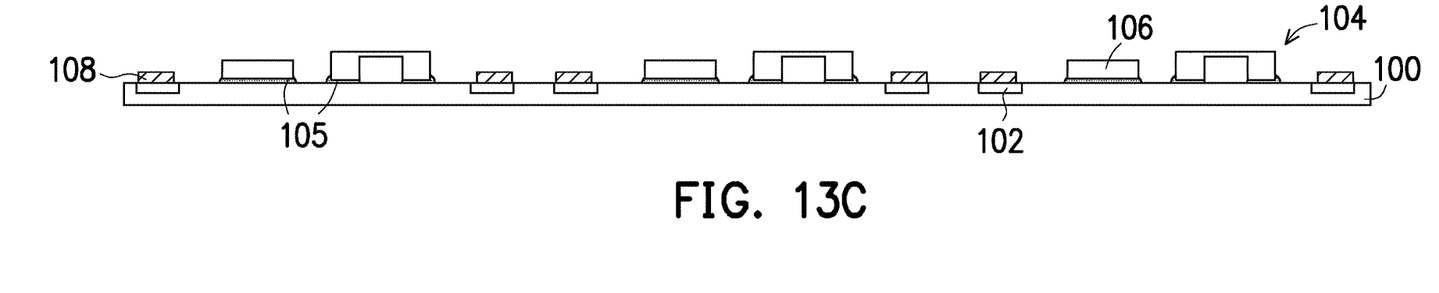

Referring to FIG. 13C, a solder paste layer 108, such as a tin solder paste, is disposed on the connection pad 102 of the packaging substrate 100. The solder paste layer 108 in an embodiment is surrounding the MEMS microphone 104 and the integrated circuit 106.

Figure 13D:
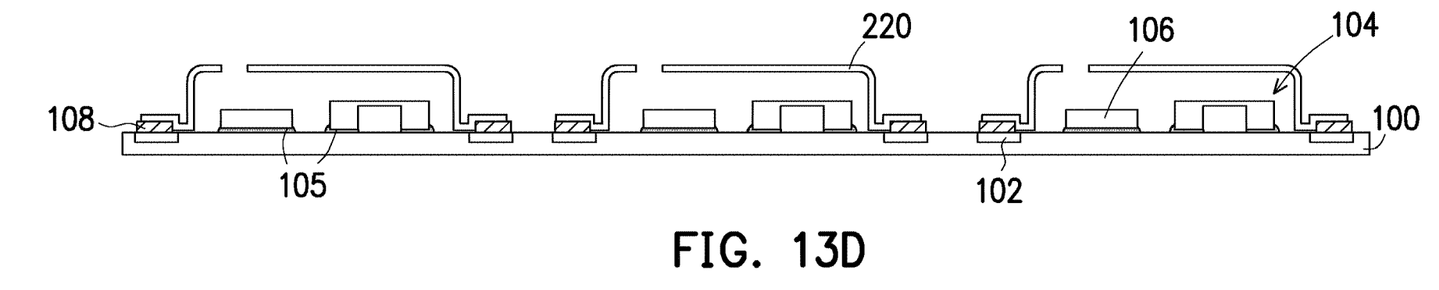

Referring to FIG. 13D, a cap structure 110 is disposed on the solder paste layer 108. In other words, the cap structure 110 is disposed over the packaging substrate 100 via the solder paste layer 108, which is disposed on the connection pad 102, surrounding the MEMS microphone 104 and the integrated circuit 106. The cap structure 220 in an embodiment is a metal cap, which may have an acoustic hole. At this stage, a curing process, such as a baking process, is performed on the solder paste layer 108, so as to solidify the solder paste layer 108.

Remarkably, the cap structure 220 has a bottom region 220a with the structure as described above, so as to isolate the solder paste layer 108. In this situation, the solder splashing effect would not occur in the MEMS microphone 104 and the integrated circuit 106.

Figure 13E:
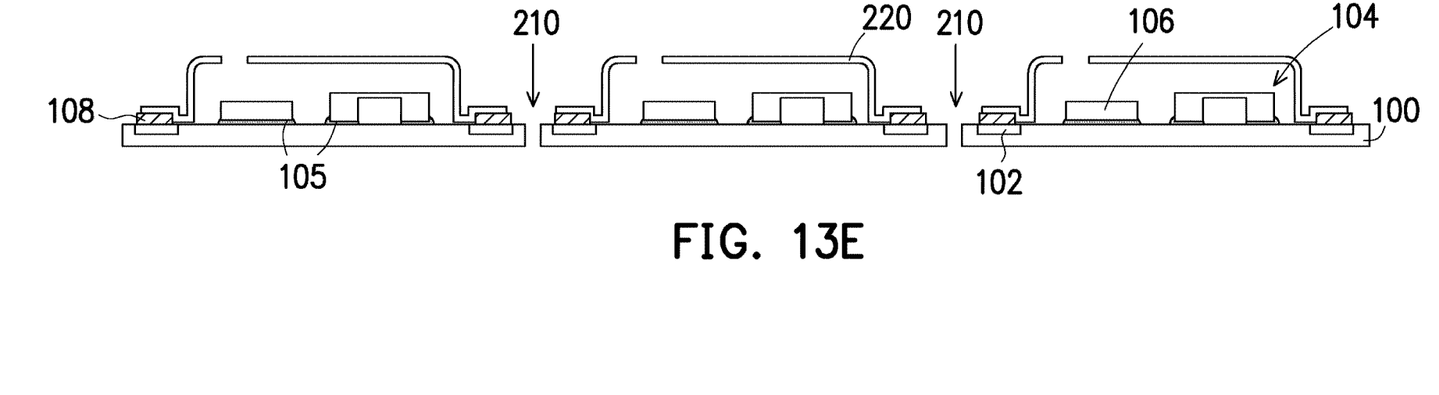

Referring to FIG. 13E, the packaging substrate 100 can be cut by a cutting process 210 along the scribe line to have a plurality of the MEMS microphone packages.

The invention has looked into the packaging process for the MEMS microphone package and found the solder splashing effect, would not occur in the MEMS microphone 104 and/or the integrated circuit 106. The invention provides multiple embodiments, in which the solder splashing effect can be effectively reduced or even eliminated.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A structure of micro-electro-mechanical-system (MEMS) microphone package, comprising:
   a packaging substrate;
   an integrated circuit, disposed on the packaging substrate;
   a MEMS microphone, disposed on the packaging substrate, wherein the MEMS microphone is electrically connected to the integrated circuit;
   a conductive adhesion layer, disposed on the packaging substrate, surrounding the integrated circuit and the MEMS microphone, without contacting to the integrated circuit and the MEMS microphone;
   a cap structure, disposed over the packaging substrate, wherein a bottom part of the cap structure is adhered to the conductive adhesion layer, wherein the cap structure with the packaging substrate forms a chamber, the cap structure does not contact to the integrated circuit and the MEMS microphone, and cap structure does not contact to the integrated circuit and the MEMS microphone through other adhesive material layer; and
   an underfill layer, disposed on the packaging substrate, covering an outer side of the conductive adhesion layer and the cap structure, for holding the cap structure onto the package substrate, without contacting to the integrated circuit and the MEMS microphone.

2. The structure of MEMS microphone package according to claim 1, wherein the integrated circuit is connected to the MEMS microphone through the packaging substrate.

3. The structure of MEMS microphone package according to claim 1, wherein the packaging substrate is a printed circuit board (PCB) substrate.

4. The structure of MEMS microphone package according to claim 1, wherein the packaging substrate comprises a connection pad ring surrounding the integrated circuit and the MEMS microphone, and the conductive adhesion layer is disposed on the connection pad ring.

5. The structure of MEMS microphone package according to claim 1, wherein the cap structure is a metal cap.

6. The structure of MEMS microphone package according to claim 5, wherein the metal cap has an acoustic hole to receive an acoustic signal.

7. The structure of MEMS microphone package according to claim 1, wherein the cap structure comprises:
   a wall, surrounding the integrated circuit and the MEMS microphone, disposed on the conductive adhesion layer;
   a top conductive adhesion layer, disposed on a top of the wall; and
   a top layer, disposed on the top conductive adhesion layer, to cover the integrated circuit and the MEMS microphone,
   wherein the underfill layer is extending along an outer side of the wall and also covers the top conductive adhesion layer.

8. The structure of MEMS microphone package according to claim 1, wherein the packaging substrate has an acoustic hole to receive an acoustic signal.

9. The structure of MEMS microphone package according to claim 1, wherein the conductive adhesion layer is a conductive epoxy layer.

10. A structure of micro-electro-mechanical-system (MEMS) microphone package, comprising:

a packaging substrate;

an integrated circuit, disposed on the packaging substrate;

a MEMS microphone, disposed on the packaging substrate, wherein the MEMS microphone is electrically connected to the integrated circuit;

a plurality of conductive adhesion islands, distributed on the packaging substrate, surrounding the integrated circuit and the MEMS microphone, without contacting to the integrated circuit and the MEMS microphone;

a cap structure, disposed over the packaging substrate, wherein a bottom part of the cap structure is adhered to the conductive adhesion islands, wherein the cap structure with the packaging substrate forms a chamber, the cap structure does not contact to the integrated circuit and the MEMS microphone, and the cap structure does not contact to the integrated circuit and the MEMS microphone through other adhesive material layer; and an underfill layer, disposed on the packaging substrate, surrounding the integrated circuit and the MEMS microphone, without contacting to the integrated circuit and the MEMS microphone, wherein a sidewall of each of the conductive adhesion islands and gaps between the cap structure and the packaging substrate without the conductive adhesion islands are enclosed by the underfill layer.

11. The structure of MEMS microphone package according to claim 10, wherein the integrated circuit is connected to the MEMS microphone through the packaging substrate.

12. The structure of MEMS microphone package according to claim 10, wherein the packaging substrate comprises a plurality of connection pads in a distribution for surrounding the integrated circuit and the MEMS microphone, and the plurality of the conductive adhesion islands are disposed on the plurality of the connection pads.

13. The structure of MEMS microphone package according to claim 10, wherein the cap structure is a metal cap.

14. The structure of MEMS microphone package according to claim 13, wherein the metal cap has an acoustic hole to receive an acoustic signal.

15. The structure of MEMS microphone package according to claim 10, wherein the packaging substrate has an acoustic hole to receive an acoustic signal.

16. A structure of micro-electro-mechanical-system (MEMS) microphone package, comprising:

a packaging substrate;

an integrated circuit, disposed on the packaging substrate;

a MEMS microphone, disposed on the packaging substrate, wherein the integrated circuit is electrically connected to the integrated circuit;

a conductive adhesion layer, disposed on the packaging substrate, surrounding the integrated circuit and the MEMS microphone, without contacting to the integrated circuit and the MEMS microphone; and a cap structure, disposed over the packaging substrate, wherein the cap structure with the packaging substrate forms a chamber, the cap structure does not contact to the integrated circuit and the MEMS microphone, and the cap structure does not contact to the integrated circuit and the MEMS microphone through other adhesive material layer, wherein the cap structure comprises:

a top plate;

a wall, having a foot standing on the packaging substrate and surrounding the integrated circuit and the MEMS microphone, wherein the top plate is disposed on the perpendicular wall;

a bottom horizontal part, disposed on the packaging substrate between the foot of the perpendicular wall and the conductive adhesion layer; and a covering part, disposed on the conductive adhesion layer and joining to the bottom horizontal part.

17. The structure of MEMS microphone package according to claim 16, wherein the integrated circuit is connected to the MEMS microphone through the packaging substrate.

18. The structure of MEMS microphone package according to claim 16, wherein the packaging substrate is a printed circuit board (PCB) substrate.

19. The structure of MEMS microphone package according to claim 16, wherein the packaging substrate comprises a connection pad surrounding the integrated circuit and the MEMS microphone, and the conductive adhesion layer is disposed on the connection pad.

20. The structure of MEMS microphone package according to claim 16, wherein the cap structure is a metal cap.

21. The structure of MEMS microphone package according to claim 20, wherein the metal cap has an acoustic hole to receive an acoustic signal.

22. The structure of MEMS microphone package according to claim 16, wherein the conductive adhesion layer is a solder paste layer.

* * * * *